(12) United States Patent
Takatori et al.

(10) Patent No.: US 10,135,548 B2
(45) Date of Patent: Nov. 20, 2018

(54) SYSTEM, APPARATUS, AND METHOD FOR AT LEAST MITIGATING A SIGNAL REFLECTION

(71) Applicant: Futurewei Technologies, Inc., Plano, TX (US)

(72) Inventors: Hiroshi Takatori, Sacramento, CA (US); Zhan Duan, Milpitas, CA (US); Purackal M. Mammen, Fremont, CA (US)

(73) Assignee: FUTUREWEI TECHNOLOGIES, INC., Plano, TX (US)

( * ) Notice: Subject to any disclaimer, the term of this patent is extended or adjusted under 35 U.S.C. 154(b) by 0 days.

(21) Appl. No.: 15/232,684

(22) Filed: Aug. 9, 2016

(65) Prior Publication Data
US 2018/0048396 A1 Feb. 15, 2018

(51) Int. Cl.
*H04B 15/00* (2006.01)
*H03G 3/30* (2006.01)

(52) U.S. Cl.
CPC ........... *H04B 15/00* (2013.01); *H03G 3/3042* (2013.01); *H03G 3/3089* (2013.01)

(58) Field of Classification Search
CPC ...... H03G 3/20; H03G 3/3042; H03G 3/3078; H03G 3/3079; H03G 3/3089; H04B 3/03; H04B 3/04; H04B 3/06; H04B 3/08; H04B 3/20; H04B 3/21; H04B 3/23; H04B 3/231; H04B 3/235; H04B 3/237; H04B 3/30; H04B 3/32; H04B 15/00; H04B 15/005; H04B 15/02

USPC ....... 375/229, 232, 254, 285, 345, 346, 348, 375/350; 370/278, 282, 286, 289, 291; 379/406.01, 406.05, 406.08, 406.15
See application file for complete search history.

(56) References Cited

U.S. PATENT DOCUMENTS 5,459,679 A * 10/1995 Ziperovich ...... G11B 20/10009
360/46
6,369,735 B1 * 4/2002 Yang ...................... H03M 1/70
341/143

(Continued)

OTHER PUBLICATIONS

Jiang, A. et al., "Design of Sparse FIR Filters With Joint Optimization of Sparsity and Filter Order," IEEE Transactions on Circuits and Systems—I: Regular Papers, vol. 62, No. 1, Jan. 2015, pp. 195-204.

(Continued)

*Primary Examiner* — Young T Tse
(74) *Attorney, Agent, or Firm* — Garlick & Markison; Bruce E. Garlick (57) ABSTRACT

An apparatus, system, and method are provided for at least mitigating a signal reflection. Included is a filter configured to receive a data signal for transmission, and filter the data signal to generate a filtered data signal. Also included is a gain regulator in electrical communication with the filter. The gain regulator is configured to receive the filtered data signal for adjusting a gain of the filtered data signal to generate a gain regulator output signal for use in at least mitigating a signal reflection. Further, a controller is provided in electrical communication with the filter and the gain regulator. The controller is configured to receive the filtered data signal, and process the filtered data signal to generate at least one controller output signal for use in controlling the filter and the gain regulator.

12 Claims, 9 Drawing Sheets

(56) References Cited

U.S. PATENT DOCUMENTS

| | | | |
|---|---|---|---|
| 7,912,151 B1* | 3/2011 | McAdam | H04L 25/03057 375/147 |
| 8,706,042 B2 | 4/2014 | Takatori | |
| 9,065,644 B2 | 6/2015 | Takatori | |
| 9,106,462 B1* | 8/2015 | Aziz | H04L 25/03057 |
| 9,172,498 B2 | 10/2015 | Takatori et al. | |
| 2007/0111687 A1* | 5/2007 | Weng | G06F 1/3203 455/127.5 |
| 2008/0240412 A1* | 10/2008 | Mezer | H04B 3/235 379/406.02 |
| 2012/0076181 A1* | 3/2012 | Aziz | H04L 25/03057 375/219 |
| 2012/0327818 A1 | 12/2012 | Takatori | |
| 2013/0039407 A1* | 2/2013 | Aziz | H04L 25/03057 375/233 |
| 2013/0077669 A1* | 3/2013 | Malipatil | H04L 25/03019 375/233 |
| 2013/0148712 A1* | 6/2013 | Malipatil | H04L 25/0307 375/233 |
| 2013/0241643 A1* | 9/2013 | Xu | H03G 3/3052 330/129 |
| 2014/0169440 A1* | 6/2014 | Kotagiri | H04L 25/063 375/233 |
| 2015/0110165 A1* | 4/2015 | Ramadoss | H04L 25/03885 375/233 |
| 2015/0249532 A1 | 9/2015 | Takatori | |
| 2016/0065394 A1* | 3/2016 | Sindalovsky | H04L 25/03012 375/371 |

OTHER PUBLICATIONS

Takatori, H., "100G Signaling Options over Backplane Classes," IEEE P802.3bj Jan. 2012 Newport Beach, pp. 1-10.

Mazinni, M. et al., "C2M CDAUI-8: considerations and proposals on P802.3bs 400 Gb/s Ethernet draft," IEEE 802.3bs Task Force, Nov. 9-12, 2015, pp. 1-17, retreived from www.ieee802.org/3/bs/public/15_11/mazzini_3bs_01_1115.pdf.

Frlan, E. et al., "Comment Resolution Worksheet for CEI-56G-XSR-PAM4," Contribution: oif2016.128.04, The Optical Internetworking Forum, 2015, pp. 1-11.

Takatori, H., "56G LR Margin over 40 inch CH," PLL 56G LR Project, oif2014.360.00, Oct. 21, 2014, pp. 1-11.

* cited by examiner

SYSTEM, APPARATUS, AND METHOD FOR AT LEAST MITIGATING A SIGNAL REFLECTION

FIELD OF THE INVENTION

The present invention relates to data communication systems, and more particularly to signal reflection mitigation in data communication systems.

BACKGROUND

A massive data traffic increase has been witnessed recently in data centers which, in turn, has forced interconnect link-speeds from lower speeds (e.g. 10~28 Gbps, etc.) to significantly higher speeds (e.g. 56 Gbps and up, etc.). Based on such demand, a throughput of such interconnects [e.g. serializer/deserializer (SerDes), etc.] has been increased by at least a factor of two, and possibly higher. Further, full-duplex communication systems are also being used. However, such increase in speed in connection with full-duplex communication systems requires more complicated signal processing (e.g. in the form of echo cancellation circuitry, etc.) that, in turn, results in an increase in power consumption and/or requisite die-area.

SUMMARY

An apparatus, system, and method are provided for at least mitigating a signal reflection. Included is a filter configured to receive a data signal for transmission, and filter the data signal to generate a filtered data signal. Also included is a gain regulator in electrical communication with the filter. The gain regulator is configured to receive the filtered data signal for adjusting a gain of the filtered data signal to generate a gain regulator output signal for use in at least mitigating a signal reflection. Further, a controller is provided in electrical communication with the filter and the gain regulator. The controller is configured to receive the filtered data signal, and process the filtered data signal to generate at least one controller output signal for use in controlling the filter and the gain regulator.

In a first embodiment, the filter, the gain regulator, and the controller may be components of a serializers/deserializer.

In a second embodiment (which may or may not be combined with the first embodiment), the filter may include a finite impulse response (FIR) filter. As an option, the filter may include a sparse FIR filter. Still yet, the gain regulator may include a digital-to-analog converter (DAC) and/or an analog-to-digital converter (ADC)

In a third embodiment (which may or may not be combined with the first and/or second embodiments), further included is a signal reflection mitigator (e.g. subtractor element, etc.) in communication with the gain regulator. The signal reflection mitigator may be configured to receive the gain regulator output signal for use in at least mitigating the signal reflection.

In a fourth embodiment (which may or may not be combined with the first, second, and/or third embodiments), the controller may be configured to process the filtered data signal by identifying a range of the filtered data signal. Further, the at least one controller output signal may include a first controller output signal for controlling the filter, and a second controller output signal for controlling the gain regulator.

In a fifth embodiment (which may or may not be combined with the first, second, third, and/or fourth embodiments), the controller may be configured to generate the at least one controller output signal for use in controlling the filter, where the filter is controlled by setting a gain of the filter. Further, the controller may be configured to generate the at least one controller output signal for use in controlling the gain regulator, where the gain regulator is controlled by setting a gain of the gain regulator.

In a sixth embodiment (which may or may not be combined with the first, second, third, fourth, and/or fifth embodiments), the controller may be configured to generate the at least one controller output signal for use in controlling the filter and the gain regulator by setting a first gain of the filter and a second gain of the gain regulator, such that the first gain of the filter is set inversely proportional to the second gain of the gain regulator.

In a seventh embodiment (which may or may not be combined with the first, second, third, fourth, fifth, and/or sixth embodiments), the controller may be further configured to measure a range in connection with the filtered data signal, and to generate the at least one controller output signal based on the measured range. As an option, the controller may be further configured such that the range is measured for a configurable amount of time. Still yet, the controller may be further configured to compare the range to a threshold, and to generate the at least one controller output signal based on the comparison.

In an eighth embodiment (which may or may not be combined with the first, second, third, fourth, fifth, sixth, and/or seventh embodiments), the controller may be further configured to generate the at least one controller output signal, based on at least one aspect of the signal reflection. Further, the controller may be further configured to generate the at least one controller output signal, based on an error measurement.

In a ninth embodiment (which may or may not be combined with the first, second, third, fourth, fifth, sixth, seventh, and/or eighth embodiments), the adjusting may be repeated until a predetermined range is reached in connection with the filtered data signal.

To this end, in some optional embodiments, one or more of the foregoing features of the aforementioned apparatus, system and/or method may be used to reduce power consumption and/or requisite die-area by affording a filter/regulator controller that optimizes an ability of such filter/regulator to effectively mitigate signal reflections in a manner that requires less power and less complicated circuitry. It should be noted that the aforementioned potential advantages are set forth for illustrative purposes only and should not be construed as limiting in any manner.

DETAILED DESCRIPTION

Some embodiments described herein relate to a serializer/deserializer (SerDes) which may refer to any apparatus that includes at least two components, one for converting data from a serial form to a parallel form, and another one for converting data from a parallel form to a serial form. Thus, in various possible applications, such SerDes may compensate for situations where there is a limitation on a number of input/output (I/O) connectors. Specifically, two systems (between which communication is desired) may each be equipped with parallel interfaces and, in such scenario, the aforementioned SerDes's may convert the parallel I/O between such parallel interfaces into a serial format for communication on a serial link which may operate at a higher rate.

In use, when a signal is transmitted by the SerDes, a signal reflection (e.g. leakage, echo, etc.) results that must be cancelled (e.g. by a subtractor or the like, etc.). Such subtraction may be accomplished both in the analog and digital domain, under the control of echo cancellation circuitry that includes a filter. Such filter typically does not operate at its full dynamic range which, in turn, results in subpar performance (and possibly more power consumption due to the specific filter type), particularly when the speed of the SerDes system increases by a factor of two (2).

To address this, various embodiments are described herein for using a controller in connection with a filter/gain regulator combination to more effectively mitigate the abovementioned signal reflection. Further, this is accomplished by receiving an output of the filter, and controlling both the filter and gain regulator based on such output of the filter. Specifically, in some optional embodiments, the foregoing controller may measure a dynamic range at the filter output, and then iteratively adjust the gains of both the filter and the gain regulator until the dynamic range at the filter output is maximized which, in turn, leads to improved signal leakage cancelation at the subtractor. In still yet other optional embodiments, some additional cost savings may be incurred by using a sparse FIR filter.

Figure 1:
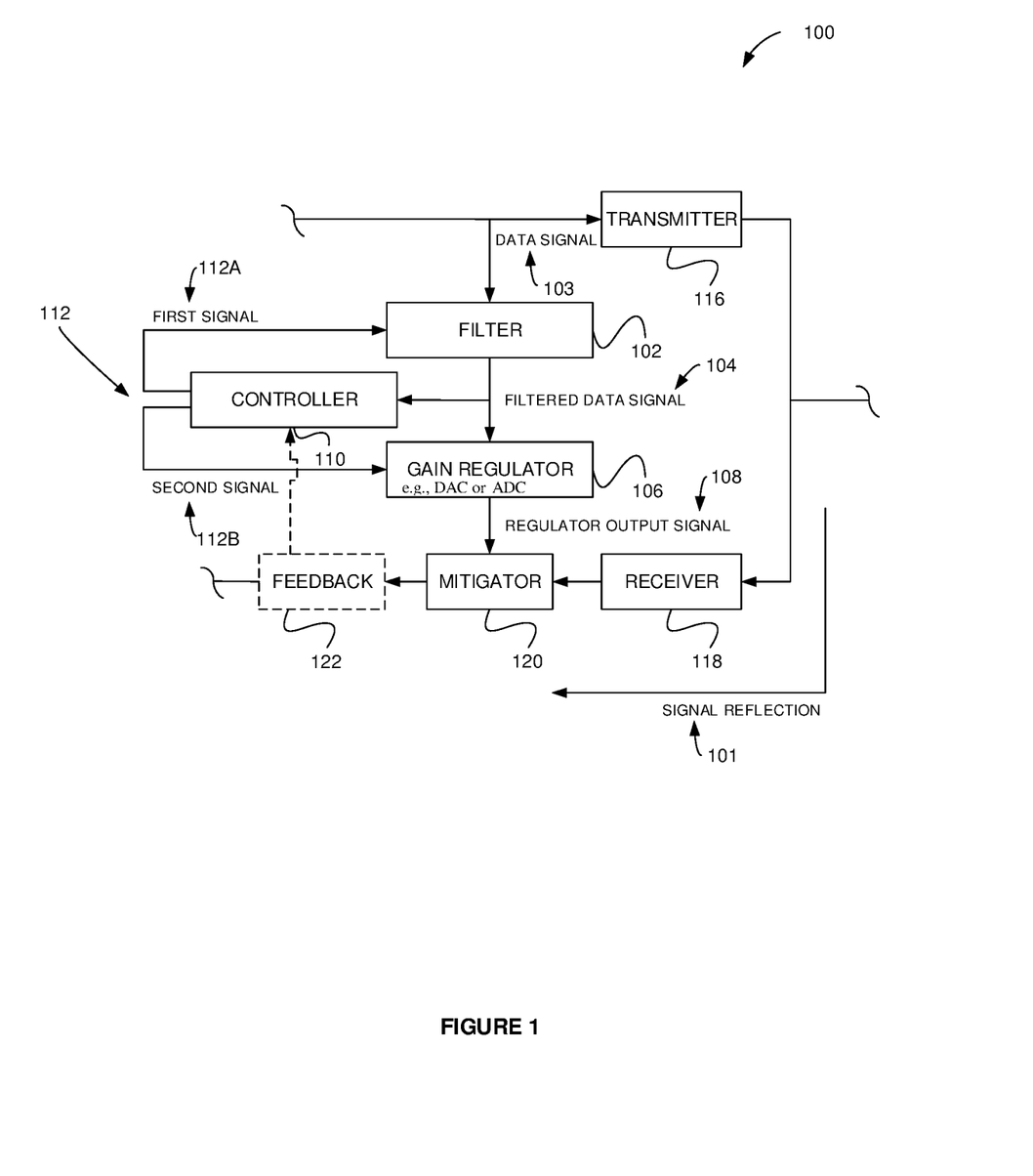
FIG. 1 illustrates an apparatus for at least mitigating a signal reflection, in accordance with one embodiment.

FIG. 1 illustrates an apparatus 100 for at least mitigating a signal reflection 101, in accordance with one embodiment. The apparatus 100 includes a filter 102, a gain regulator 106, a controller 110, a transmitter 116, a receiver 118, and a mitigator 120 interconnected in the manner as shown. In one embodiment, the apparatus 100 may take the form of a SerDes. In one embodiment, the aforementioned SerDes may be implemented in the context of a full-duplex communication system. With that said, other embodiments are contemplated where the apparatus 100 may take the form of other high speed link designs.

In use in accordance with one possible embodiment (among many that will be described later), the filter 102 receives a data signal 103 to be transmitted by the transmitter 116 (and which will be the basis for the signal reflection 101). Further, the controller 110 measures an output (see signal 104) of the filter 102 (e.g. by measuring a dynamic range thereof), and then controls both the filter 102 and the gain regulator 106 (e.g. by setting a gain for each), based on the foregoing measurement.

As an option, this measurement/control may be iterated until the dynamic range of the output of the filter 102 reaches a certain threshold. Specifically, after each measurement, the gain of the filter 102/gain regulator 106 is adjusted that, in turn, results in a different, more optimal range. Further, it is quite possible that the first change in such range will not produce a sufficiently optimal range. In such case, the measurement/control may be repeated to refine the gain of the filter 102/gain regulator 106 until the optimal range is achieved. When such dynamic range threshold is reached, the gain regulator 106 receives the signal 104 in a form that more accurately represents the data signal 103 since it is filtered utilizing an optimized dynamic range of the filter 102.

By this design, an output of the gain regulator 106 (see signal 108) is also optimized (since it is based on the signal 104), for use by the mitigator 120 in at least mitigating the signal reflection 101 (e.g. by cancelling, subtracting, etc. it from received signals). Specifically, since the data signal 103 is filtered utilizing the optimized dynamic range of the filter 102 before being used by the gain regulator 106 and, ultimately, by the mitigator 120 to mitigate the signal reflection 101, such mitigation is also optimized because the signal 108 (that is subtracted from received signals) more accurately represents the data signal 103 that is ultimately causing the signal reflection 101. Further, in addition to such increased performance, other possible benefits may be incurred such as lower power usage, particularly in embodiments where the filter 102 takes the form of a sparse finite impulse response (FIR) filter.

More information will now be set forth regarding the functionality and cooperation of the various components of the apparatus 100. For example, in various embodiments, the filter 102, the gain regulator 106, and the controller 110 may operate in a digital domain, while the mitigator 120 may operate in either a digital or analog domain.

In the context of the present description, the aforementioned signal reflection 101 may include any signal that occurs as a result of: a signal being transmitted along a transmission medium (including one or more channels, etc.) in a first direction, and at least some of a signal power of the signal being reflected in a second direction. For example, in one embodiment, such signal reflection 101 may include an echo. Still yet, in another possible embodiment, the signal reflection 101 may include an echo that is received at the receiver 118 as a result of a signal being transmitted from the transmitter 116, in the manner shown in FIG. 1.

As for the filter 102, such component is configured to receive the data signal 103 for transmission, as mentioned earlier. In the context of the present description, such data signal 103 for transmission may be received at any point before, during, or after transmission. For example, in one exemplary embodiment shown in FIG. 1, such data signal 103 for transmission may be received before such signal is transmitted by the transmitter 116 of the apparatus 100. In operation, the filter 102 serves to filter the data signal 103 to generate the filtered data signal 104. In the present description, such filtering may include any processing that, at the very least, removes one or more components or features of the data signal 103.

In one optional embodiment, the filter 102 may include a FIR filter. In the present description, such FIR filter may refer to any filter whose impulse response (or response to any finite length input) is of a finite duration (i.e. it settles to zero or near zero in a finite time, etc.). As a further option, the filter may include a sparse FIR filter. Such sparse FIR filter may include any FIR filter for which at least a majority (e.g. >50%, 60%, 70%, 80%, etc.) of coefficients are (or near) zero (0). By virtue of such design, the apparatus 100 may, in some embodiments, be less expensive to manufacture.

Moving now to the gain regulator 106, such component is in electrical communication with the filter 102. In operation, the gain regulator 106 is configured to receive the filtered data signal 104 for adjusting a gain of the filtered data signal 104 (under the direction of the controller 110) to generate the gain regulator output signal 108 for use in at least mitigating the signal reflection 101 (e.g. echo signal, etc.). In the context of the present description, the gain regulator 106 may refer to any circuit that is configured to control a gain of a signal. In various embodiments, the gain regulator 106 may include a digital-to-analog converter (DAC), an analog-to-digital converter (ADC), an automatic gain controller (AGC), or any other circuit configured, for that matter, to control a gain of a signal as well as optionally perform other processing for conditioning the same for a next stage of further processing.

In order to at least mitigate the signal reflection 101 as set forth above, the signal reflection mitigator 120 remains in communication with the gain regulator 106 and an output of the receiver 118 of the apparatus 100. In operation, the signal reflection mitigator 120 may be configured to receive the gain regulator output signal 108 for use in at least mitigating the signal reflection 101. In some embodiments, the signal reflection mitigator 120 may be effective enough to completely cancel the signal reflection 101. Further, in one possible embodiment, the signal reflection mitigator 120 may include a subtractor element, as will be described in subsequent embodiments, for subtracting (e.g. removing, etc.) the signal reflection 101 from the output of the receiver 118 of the apparatus 100.

As set forth earlier, the controller 110 is provided in electrical communication with the filter 102 and the gain regulator 106. In use, the controller 110 is configured to receive the filtered data signal 104, and process the filtered data signal 104 to generate at least one controller output signal 112 for use in controlling the filter 102 and the gain regulator 106. In one possible embodiment, the at least one controller output signal 112 may include a first controller output signal 112A for controlling the filter 102, and a second controller output signal 112B for controlling the gain regulator 106.

In one embodiment, the controller 110 may be configured to process the filtered data signal 104 by identifying (e.g. measuring, etc.) a range of the filtered data signal 104, where such range is used to generate the at least one controller output signal 112. Further, the controller 110 may be configured to generate the first controller output signal 112A for use in controlling the filter 102, by setting a first gain of the filter 102. In one embodiment, such gain of the filter 102 may be set by setting coefficients of the filter 102. Still yet, the controller 110 may be configured to generate the second controller output signal 112B for use in controlling the gain regulator 106, by setting a second gain of the gain regulator 106. For reasons that will soon become apparent, the at least one controller output signal 112 may be configured such that the first gain of the filter 102 is set inversely proportional to the second gain of the gain regulator 106.

To this end, the controller 110 may be configured to measure a range in connection with the filtered data signal 104, and to generate the first, second controller output signals 112A, 112B based on such measured range. As an option, the controller 110 may be further configured such that the range is measured for a configurable amount of time. Still yet, the controller 110 may be further configured to compare the range to a threshold, and to generate the first, second controller output signals 112A, 112B based on the comparison.

Specifically, to the extent that the filtered data signal 104 does not exhibit a predetermined threshold range for a predetermined amount of time, the controller 110 may generate the first, second controller output signals 112A, 112B, so that the gains of the filter 102 and gain regulator 106 are adjusted (e.g. in a linear inversely proportional manner) in order to improve the range of the filtered data signal 104. Further, this range measurement and gain adjustment may be repeated until the filtered data signal 104 exhibits the predetermined threshold range for the predetermined amount of time. More information regarding such operation in the context of another embodiment will be set forth during the description of FIG. 6A.

By this design, the controller 110 uses the measured range of the filtered data signal 104 in order to adjust the filter 102 and the gain regulator 106, so as to optimize the filtered data signal 104 (and thus the gain regulator output signal 108) for use in at least mitigating the signal reflection 101 (e.g. echo signal, etc.) via the signal reflection mitigator 120. As mentioned earlier, this is accomplished by ensuring that the filter 102 operates at an optimized dynamic range so that the filtered data signal 104, and the gain regulator output signal 108 used in at least mitigating the signal reflection 101, more accurately reflects the data signal 103. This, in turn, results in better mitigation of the signal reflection 101 since that which is removed from received signals more accurately reflects the data signal 103 that causes the signal reflection 101.

Strictly as an option, the controller 110 may even be configured to generate the first, second controller output signals 112A, 112B, based on at least one aspect of the signal reflection 101 itself. For example, in a more closed-loop embodiment, the controller 106 may be further configured to generate the first, second controller output signals 112A, 112B, based on an error measurement [(bit error rate (BER)], which may fluctuate based on the signal reflection 101. Such HER may be identified in any desired conventional manner (e.g. via an optional feedback component 122, etc.).

Thus, in some optional embodiments, one or more of the foregoing features of the aforementioned apparatus 100 may be used to reduce power consumption and/or requisite die-area by affording a filter/regulator controller 110 that optimizes an ability of the filter 102 and the gain regulator 106 to effectively mitigate the signal reflection 101 in a manner that requires less power and less complicated circuitry. It should be noted that the aforementioned potential advantages are set forth for illustrative purposes only and should not be construed as limiting in any manner.

More illustrative information will now be set forth regarding various optional architectures and uses in which the foregoing method may or may not be implemented, per the desires of the user. It should be noted that the following information is set forth for illustrative purposes and should not be construed as limiting in any manner. Any of the following features may be optionally incorporated with or without the exclusion of other features described.

Figure 2:
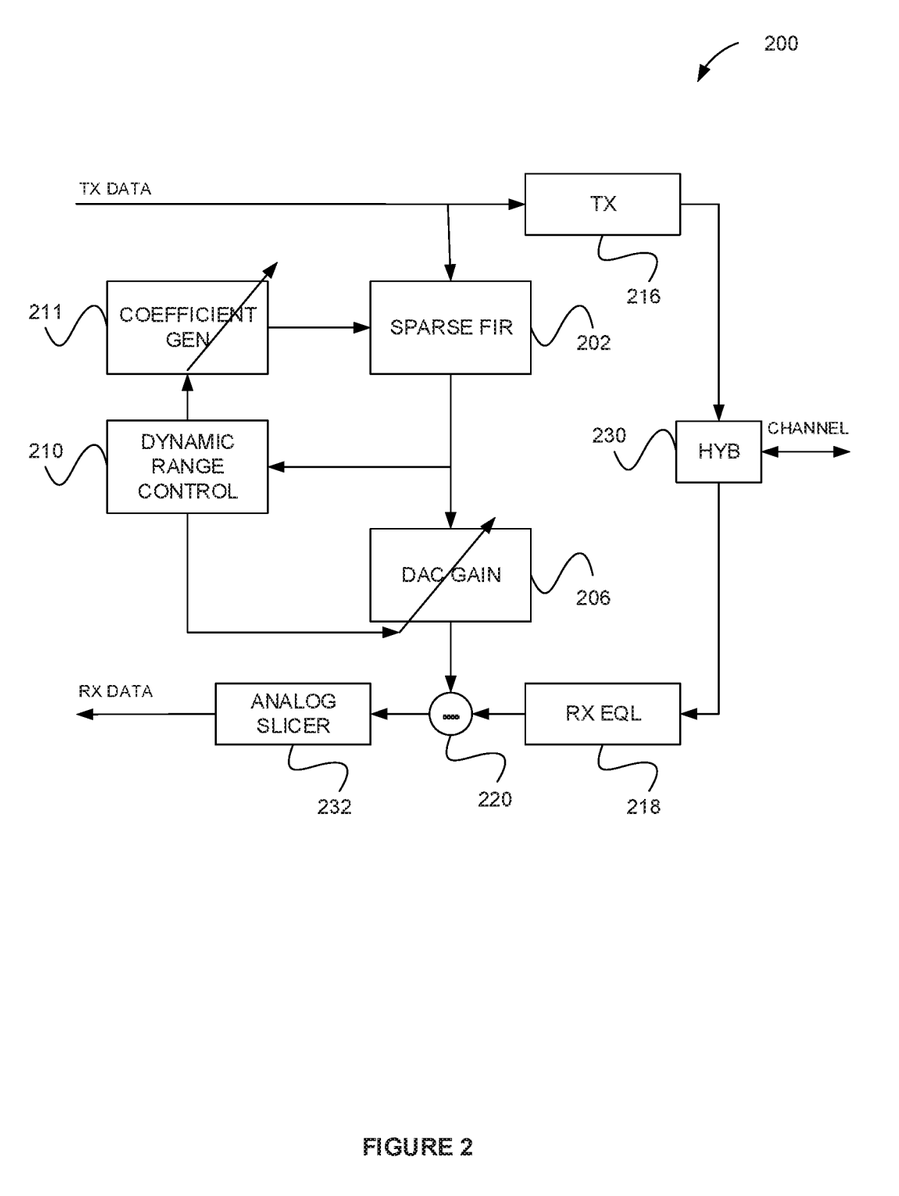
FIG. 2 illustrates an apparatus for at least mitigating a signal reflection, in accordance with an analog embodiment.

FIG. 2 illustrates an apparatus 200 for at least mitigating a signal reflection, in accordance with an analog embodiment. As an option, the apparatus 200 may be implemented with one or more of the features of any one or more of the embodiments set forth in any previous and/or subsequent figure(s) and/or description thereof. However, it is to be appreciated that the apparatus 200 may be implemented in the context of any desired environment.

As shown, the apparatus 200 is similar to the apparatus 100 of FIG. 1 insofar as the apparatus 200 includes a sparse FIR filter 202 and a transmitter 216. The apparatus 200 further includes a first-order echo canceller 230 for cancelling at least a portion of an echo, a receiver equalizer 218 to process incoming signals to condition the same for further subsequent processing, and an analog slicer 232 for determining whether an incoming signal is a "1" or a "0."

Still yet, the apparatus 200 includes a DAC 206 with an adjustable gain that feeds an analog subtractor 220 for subtracting any signal reflection (e.g. echo, etc.) output from the receiver equalizer 218 before being received by the analog slicer 232. Controlling the sparse FIR filter 202 and the DAC 206 is a dynamic range controller 210 that repeatedly (e.g. periodically, etc.) measures a dynamic range of an output of the sparse FIR filter 202. This measurement is, in turn, used for the purpose of setting coefficients and thus the gain) of the sparse FIR filter 202 via a coefficient generator 211, and further setting an adjustable gain of the DAC 206 (inversely proportional to the gain of the sparse FIR filter 202), for optimizing an ability of the analog subtractor 220 to subtract any signal reflection.

Specifically, the FIR filter 202 receives a data signal to be transmitted by the transmitter 216 (and which will be the basis for any signal reflection). Further, the dynamic range controller 210 measures a dynamic range of an output of the FIR filter 202, and then sets a gain of both the FIR filter 202 and the DAC 206, based on the foregoing measurement. In use, this measurement/gain setting may be iterated until the dynamic range of the output of the FIR filter 202 reaches a certain threshold. When such dynamic range threshold is reached, the FIR filter 202 outputs (and the DAC 206 receives) a signal in a form that more accurately represents the data signal received by the FIR filter 202 since it is filtered utilizing an optimized dynamic range of the FIR filter 202.

By this design, an output of the FIR filter 202 and thus the output of the DAC 206 are optimized for use by the analog subtractor 220 in subtracting any signal reflection 101 from received signals. Specifically, since an input of the transmitter 216/FIR filter 202 is filtered utilizing the optimized dynamic range of the FIR filter 202 before being used by the analog subtractor 220 to subtract any signal reflection, such cancellation is also optimized because the output of the DAC 206 (that is subtracted from received signals) more accurately represents the data signal at the input of the transmitter 216 (that is ultimately causing any such signal reflection). Further, in addition to such increased performance, other possible benefits may be incurred such as lower power usage, particularly in embodiments where the FIR filter 202 takes the form of a sparse FIR filter.

Figure 3:
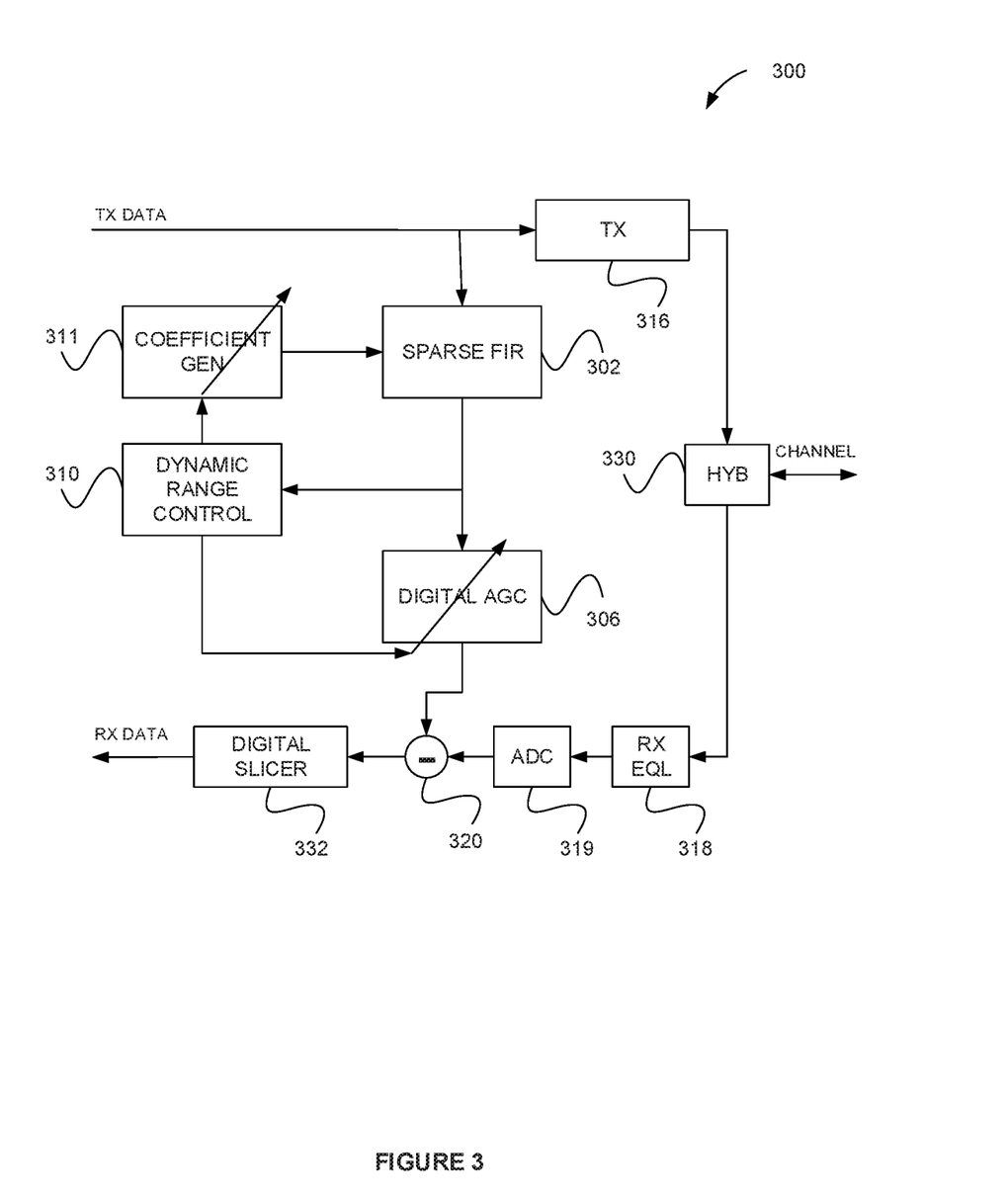
FIG. 3 illustrates an apparatus for at least mitigating a signal reflection, in accordance with a digital embodiment.

FIG. 3 illustrates an apparatus 300 for at least mitigating a signal reflection, in accordance with a digital embodiment. As an option, the apparatus 300 may be implemented with one or more of the features of any one or more of the embodiments set forth in any previous and/or subsequent figure(s) and/or description thereof. However, it is to be appreciated that the apparatus 300 may be implemented in the context of any desired environment.

As shown, the apparatus 300 is similar to the apparatus 200 of FIG. 2 insofar as the apparatus 300 includes a sparse FIR filter 302, a transmitter 316, a first-order echo canceller 330, a receiver equalizer 318, a dynamic range controller 310, and a coefficient generator 311. In contrast, however, the apparatus 300 includes a digital AGC 306 for controlling a gain of a signal received from the sparse FIR filter 302, and further control a digital subtractor 320 for subtracting any signal reflection (e.g. echo, etc.) output from an analog-to-digital (ADC) converter 319 before being received by a digital slicer 332. Apart from such different componentry, the dynamic range controller 310 may operate similar to the dynamic range controller 210 of FIG. 2, in terms of optimizing the manner in which any signal reflection is at least mitigated.

Figure 4:
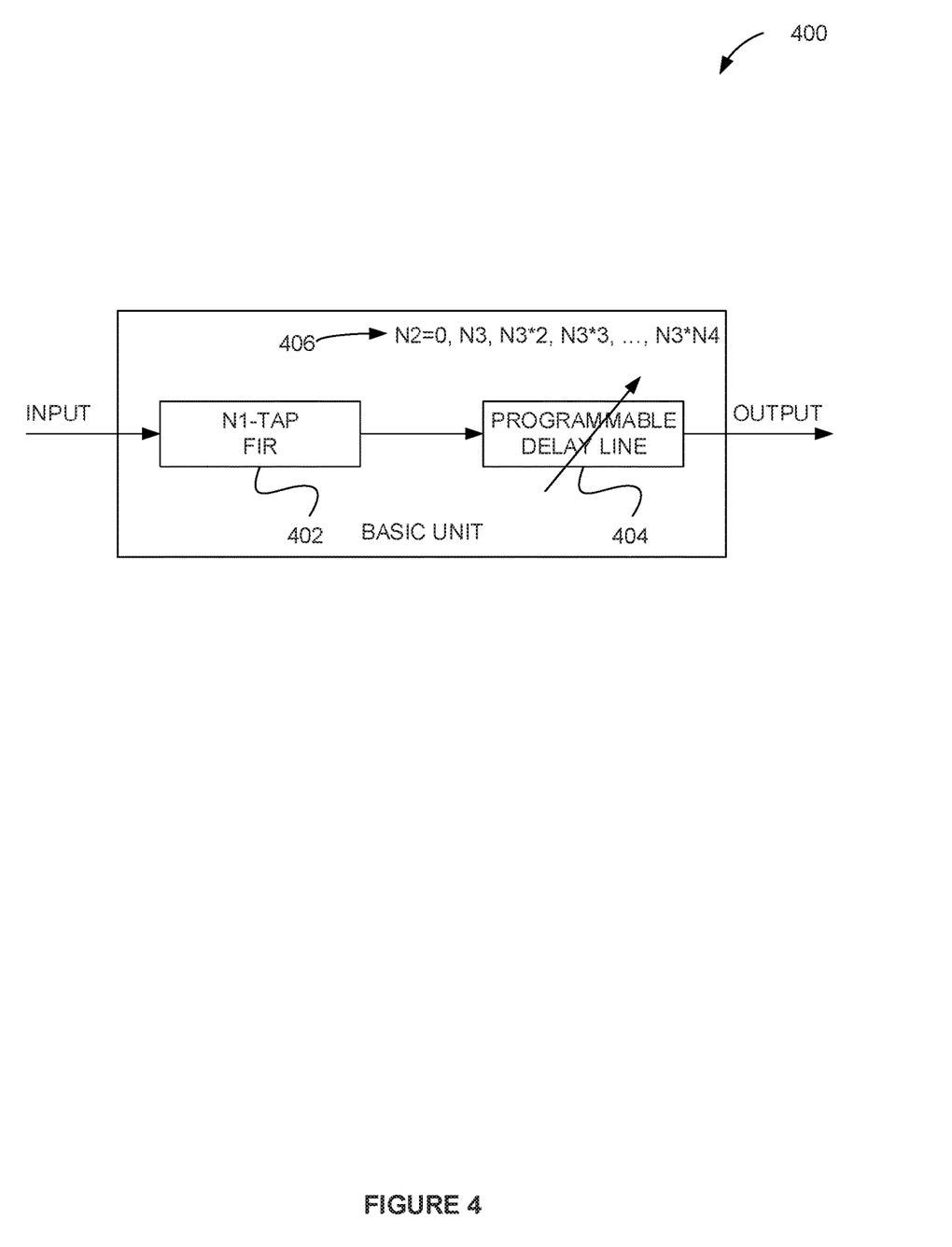
FIG. 4 illustrates a sparse finite impulse response (FIR) filter, in accordance with one embodiment.

FIG. 4 illustrates a sparse FIR filter 400, in accordance with one embodiment. As an option, the sparse FIR filter 400 may be implemented in the context of any one or more of the embodiments set forth in any previous and/or subsequent figure(s) and/or description thereof. For example, the sparse FIR filter 400 may be implemented in the context of the sparse FIR filter 202 of FIG. 2 and/or the sparse FIR filter 302 of FIG. 3. However, it is to be appreciated that the sparse FIR filter 400 may be implemented in the context of any desired environment.

Figure 5:
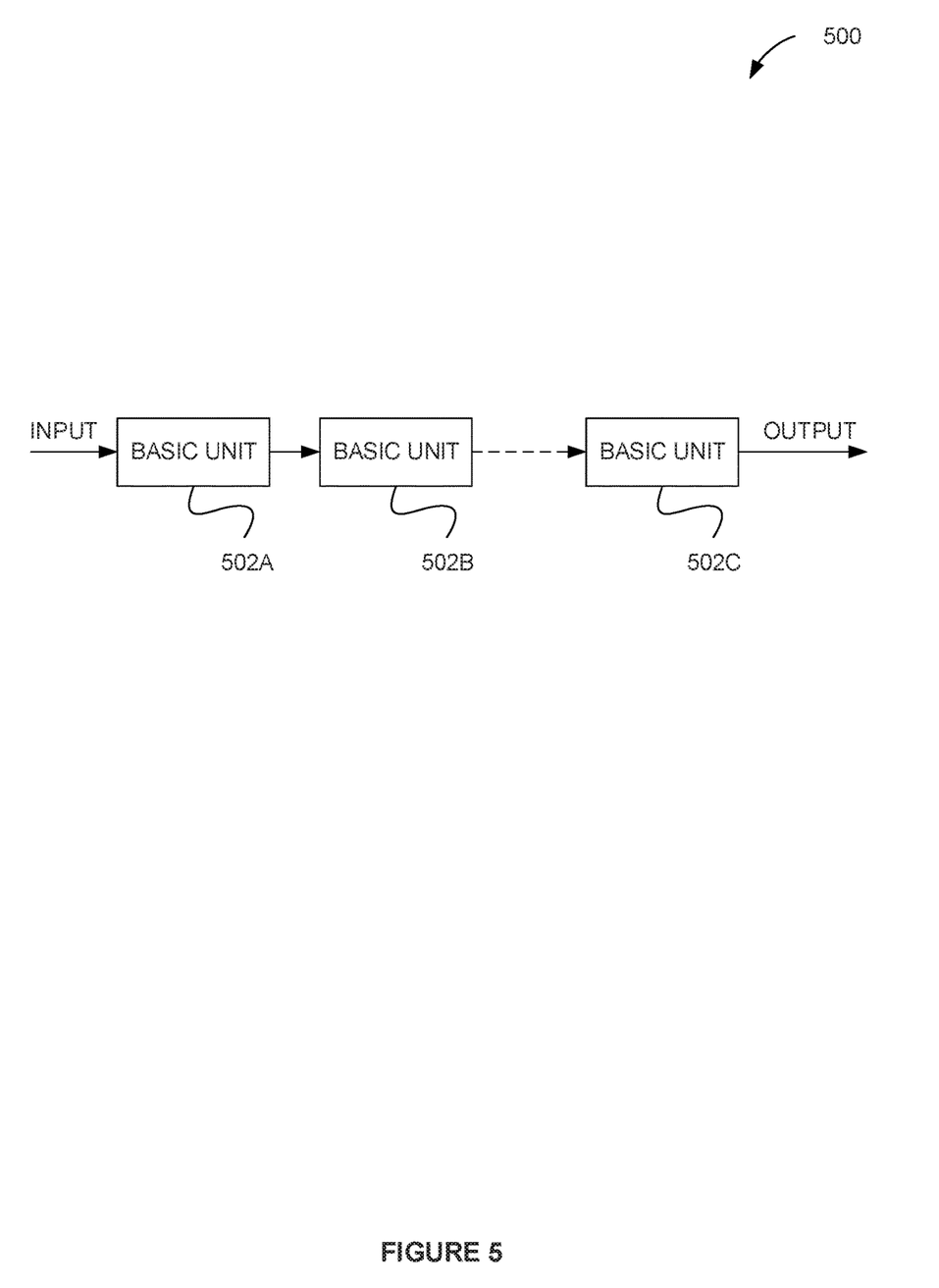
FIG. 5 illustrates an apparatus including a string of cascaded FIR filters, in accordance with one embodiment.

As shown, the sparse FIR filter 400 includes a N1-Tap FIR element 402 that feeds a programmable delay line element 404. In use, the programmable delay line element 404 serves to control a location and length of an output of the sparse FIR filter 400. This may be accomplished by setting various coefficients 406, as illustrated. By this design, the sparse FIR filter 400 may be cascaded to form a multi-tap apparatus. FIG. 5 illustrates an apparatus 500 including a string of cascaded FIR filters 502A, 502B, 502C in accordance with one embodiment.

Figure 6A:
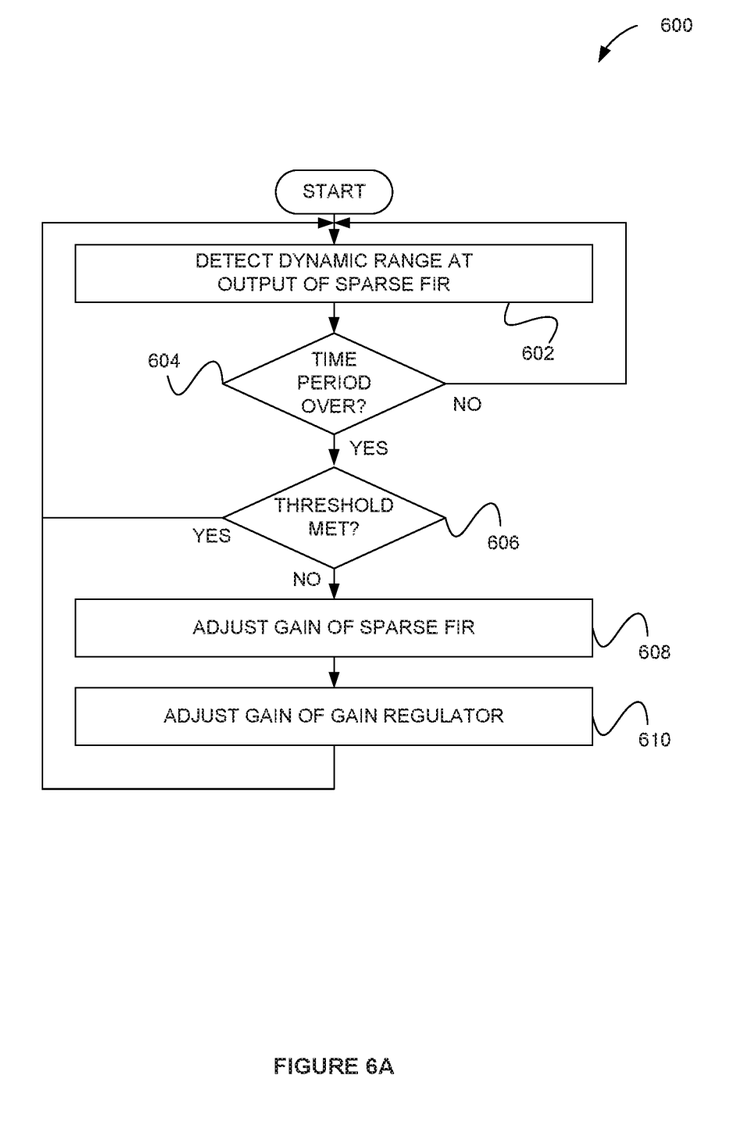
FIG. 6A illustrates a method for at least mitigating a signal reflection, in accordance with one embodiment.

FIG. 6A illustrates a method 600 for at least mitigating a signal reflection, in accordance with one embodiment. As an option, the method 600 may be implemented in the context of any one or more of the embodiments set forth in any previous and/or subsequent figure(s) and/or description thereof. For example, the method 600 may be carried out in the context of the controller 110 of FIG. 1, the dynamic range controller 210 of FIG. 2, and/or the dynamic range controller 310 of FIG. 3. However, it is to be appreciated that the method 600 may be implemented in the context of any desired environment.

As shown, in operation 602, a dynamic range is detected at an output of a sparse FIR filter (e.g. the sparse FIR filter 202 of FIG. 2, the sparse FIR filter 302 of FIG. 3, etc.). Such dynamic range may be detected in any desired manner. For example, a maximum positive and negative peak magnitude may be detected for calculating a range therebetween. Of course, other techniques are contemplated for detecting such dynamic range, as well. Further, such detection may be carried out over a predetermined and/or configurable time period, as indicated by decision 604.

Upon the cessation of the foregoing time period, it is determined whether the dynamic range exceeds a predetermined threshold in decision 606. In one embodiment, such threshold may be 70% of a full range. It should be noted, however, that other embodiments are contemplated where such threshold may involve different percentages of the full range (e.g. 50%, 60%, 80%, 90%, and/or any other integer in the range between 20%-100%).

Achieving a threshold dynamic range may be accomplished, in operation 608, by setting a proper gain of the sparse FIR filter (e.g. via the coefficient generator 211 of FIG. 2, etc.). Still yet, in operation 610, the gain of a gain regulator (e.g. the converter 206 of FIG. 2, the AGC 306 of FIG. 3, etc.) may be set (e.g. by adjusting a gain control input thereof, etc.). As mentioned earlier, the adjustment of the gain regulator gain may be inversely and linearly proportional to the adjustment of the sparse RR filter, in accordance with one embodiment. In other embodiments, however, the relationship between such gain adjustments may vary (e.g. not be linearly proportional, etc.).

In any case, an output of the gain regulator may be optimized to better mitigate a signal reflection (e.g. echo, etc.) using an appropriate signal reflection mitigator (e.g. the subtractor 220 of FIG. 2, the subtractor 320 of FIG. 3, etc.). For example, in one embodiment, the iterative process that is shown in the method 600 may be repeated (and respective gains adjusted in response to changes in the dynamic range) until a full or threshold range is exhibited by an output of the sparse FIR filter, where such full or threshold range filter output signal may then, in turn, be used to control the signal reflection mitigator via a gain regulator for optimal echo mitigation (and possibly cancellation altogether). Such configuration of elements and operation thereof may thus, in one embodiment, enable the sparse FIR filter to more ideally regenerate (or mimic) any echo, so that it can be subtracted more readily via the appropriate signal reflection mitigator, as described earlier.

Further, such arrangement may further reduce power consumption and/or requisite die-area by virtue of the use of the sparse FIR filter and the accompanying smaller number of requisite circuit components. Again, it should be noted that the aforementioned potential advantages are set forth for illustrative purposes only and should not be construed as limiting in any manner.

Figure 6B:
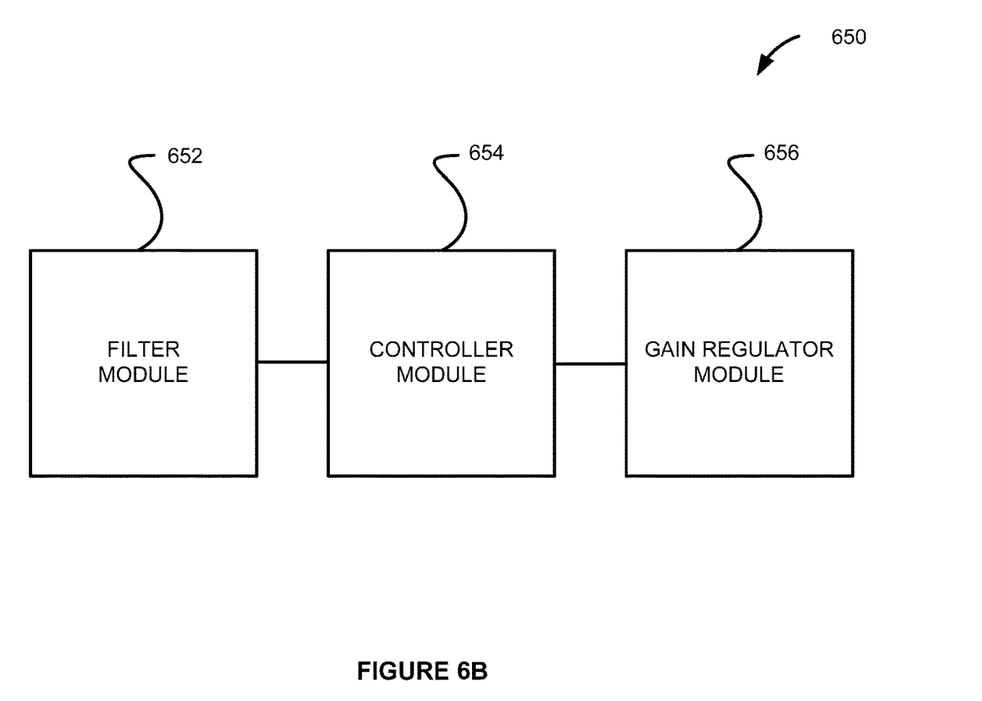
FIG. 6B illustrates a system for at least mitigating a signal reflection, in accordance with one embodiment.

FIG. 6B illustrates a system 650 for at least mitigating a signal reflection, in accordance with one embodiment. As an option, the system 650 may be implemented with one or more features of any one or more of the embodiments set forth in any previous and/or subsequent figure(s) and/or the description thereof. However, it is to be appreciated that the system 650 may be implemented in the context of any desired environment.

As shown, a filter means in the form of a filter module 652 is provided for filtering a data signal to generate a filtered data signal. In various embodiments, the filter module 652 may include, but is not limited to the filter 102 of FIG. 1, the sparse FIR filter 202 of FIG. 2, the sparse FIR filter 302 of FIG. 2, the sparse FIR filter 400 of FIG. 4, the apparatus 500 of FIG. 5, at least one processor (to be described later) and any software controlling the same, and/or any other circuitry capable of the aforementioned functionality.

Also included is a gain regulator means in the form of a gain regulator module 656 that adjusts a gain of the filtered data signal to generate a gain regulator output signal for use in at least mitigating a signal reflection that may interfere with the receipt and processing of received signals. In various embodiments, the gain regulator module 656 may include, but is not limited to the gain regulator 106 of FIG. 1, the DAC 206 of FIG. 2, the digital AGC 306 of FIG. 3, at least one processor (to be described later) and any software controlling the same, and/or any other circuitry capable of the aforementioned functionality.

With continuing reference to FIG. 6B, controller means in the form of a controller module 654 is in communication with the filter module 652 and the gain regulator module 656. In use, the controller module 654 processes the filtered data signal to generate at least one controller output signal for use in controlling the filter means and the gain regulator means. In various embodiments, the controller module 654 may include, but is not limited to the controller 110 of FIG. 1, the dynamic range controller 210/coefficient generator 211 of FIG. 2, the dynamic range controller 310/coefficient generator 311 of FIG. 3, at least one processor (to be described later) and any software controlling the same, and/or any other circuitry capable of the aforementioned functionality.

Figure 7:
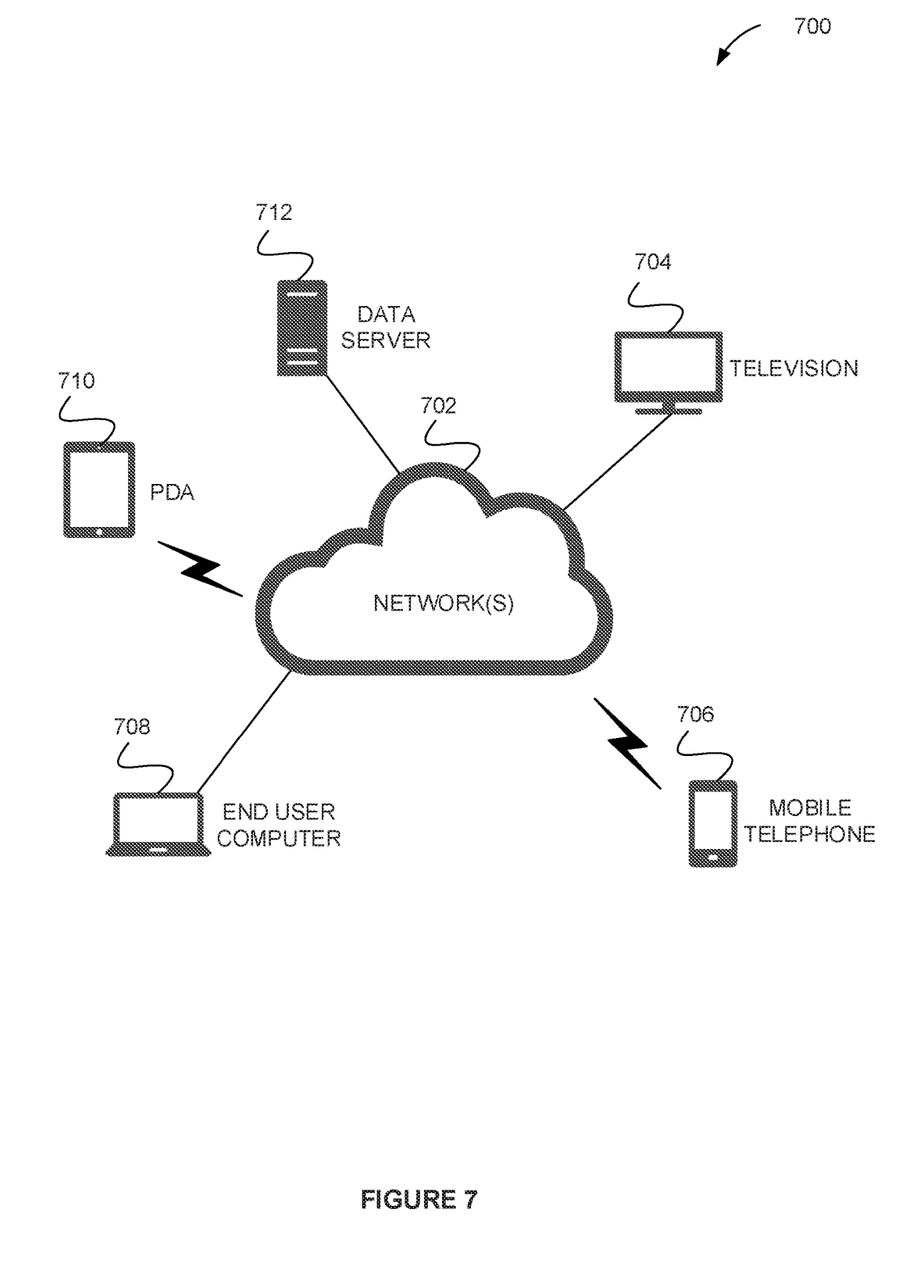
FIG. 7 illustrates a network architecture, in accordance with embodiment.

FIG. 7 illustrates a network architecture 700, in accordance with one embodiment. As shown, at least one network 702 is provided. In one embodiment, any one or more of the apparatuses 100, 200, 300 of FIGS. 1-3 may be implemented in the context of any of the components of the at least one network 702.

In the context of the present network architecture 700, the network 702 may take any form including, but not limited to a telecommunications network, a local area network (LAN), a wireless network, a wide area network (WAN) such as the Internet, peer-to-peer network, cable network, etc. While only one network is shown, it should be understood that two or more similar or different networks 702 may be provided.

Coupled to the network 702 is a plurality of devices. For example, a server computer 712 and an end user computer 708 may be coupled to the network 702 for communication purposes. Such end user computer 708 may include a desktop computer, lap-top computer, and/or any other type of logic. Still yet, various other devices may be coupled to the network 702 including a personal digital assistant (RDA) device 710, a mobile phone device 706, a television 704, etc.

Figure 8:
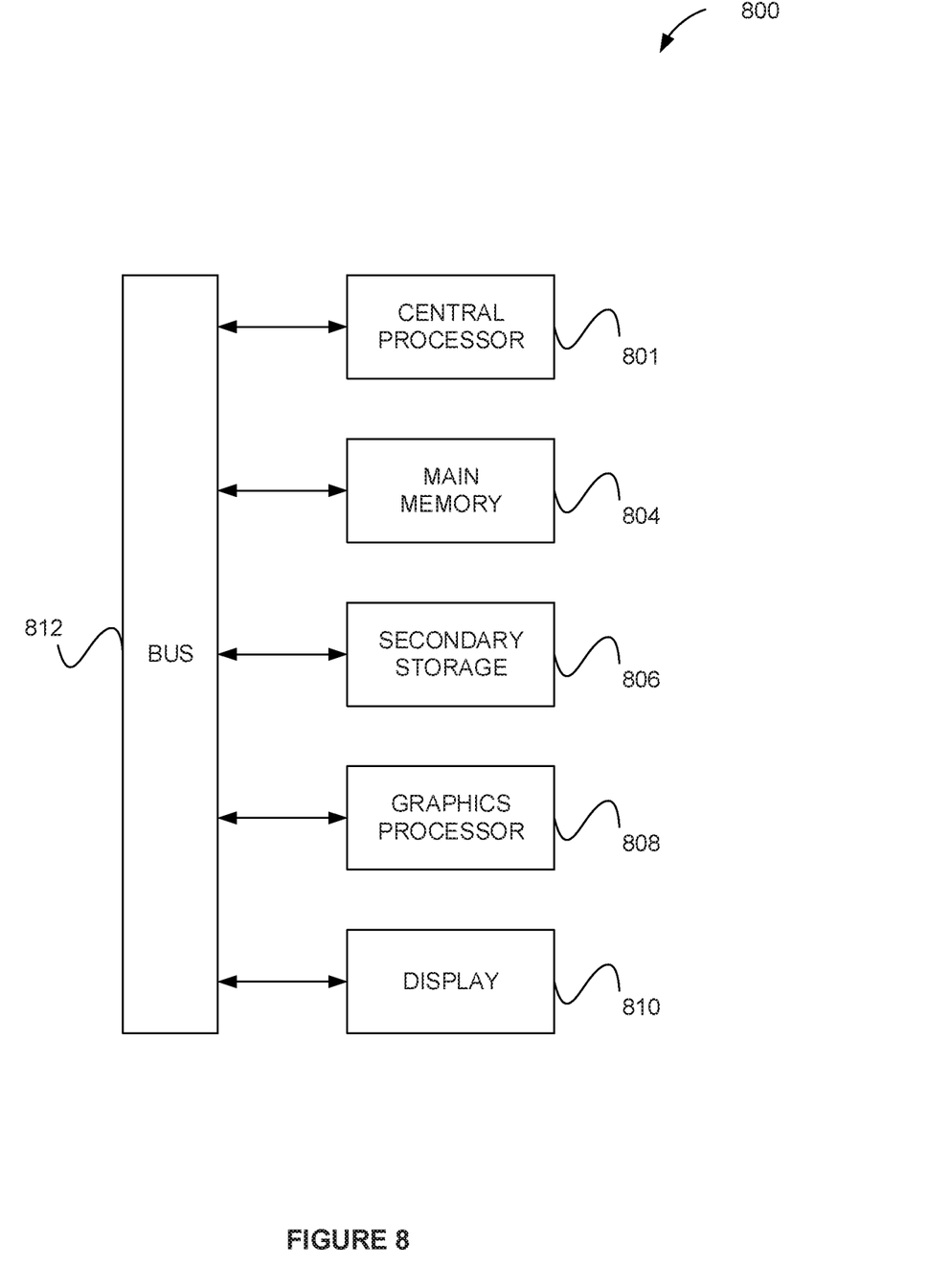
FIG. 8 illustrates an exemplary system, in accordance with one embodiment.

FIG. 8 illustrates an exemplary system 800, in accordance with one embodiment. As an option, the system 800 may be implemented in the context of any of the devices of the network architecture 700 of FIG. 7. However, it is to be appreciated that the system 800 may be implemented in any desired environment.

As shown, a system 800 is provided including at least one central processor 802 which is connected to a bus 812. The system 800 also includes main memory 804 [e.g., hard disk drive, solid state drive, random access memory (RAM), etc.]. The system 800 also includes a graphics processor 808 and a display 810.

The system 800 may also include a secondary storage 806. The secondary storage 806 includes, for example, a hard disk drive and/or a removable storage drive, representing a floppy disk drive, a magnetic tape drive, a compact disk drive, etc. The removable storage drive reads from and/or writes to a removable storage unit in a well-known manner.

Computer programs, or computer control logic algorithms, may be stored in the main memory 804, the secondary storage 806, and/or any other memory, for that matter. Such computer programs, when executed, enable the system 800 to perform various functions (as set forth above, for example). Memory 804, secondary storage 806 and/or any other storage are possible examples of non-transitory computer-readable media.

It is noted that the techniques described herein, in an aspect, are embodied in executable instructions stored in a computer readable medium for use by or in connection with an instruction execution machine, apparatus, or device, such as a computer-based or processor-containing machine, apparatus, or device. It will be appreciated by those skilled in the art that for some embodiments, other types of computer readable media are included which may store data that is accessible by a computer, such as magnetic cassettes, flash memory cards, digital video disks, Bernoulli cartridges, random access memory (RAM), read-only memory (ROM), and the like.

As used here, a "computer-readable medium" includes one or more of any suitable media for storing the executable instructions of a computer program such that the instruction execution machine, system, apparatus, or device may read (or fetch) the instructions from the computer readable medium and execute the instructions for carrying out the described methods. Suitable storage formats include one or more of an electronic, magnetic, optical, and electromagnetic format. A non-exhaustive list of conventional exemplary computer readable medium includes: a portable computer diskette; a RAM; a ROM; an erasable programmable read only memory (EPROM or flash memory); optical storage devices, including a portable compact disc (CD), a portable digital video disc (DVD), a high definition DVD (HD-DVD™), a BLU-RAY disc; and the like.

It should be understood that the arrangement of components illustrated in the Figures described are exemplary and that other arrangements are possible. It should also be understood that the various system components (and means) defined by the claims, described below, and illustrated in the various block diagrams represent logical components in some systems configured according to the subject matter disclosed herein.

For example, one or more of these system components (and means) may be realized, in whole or in part, by at least some of the components illustrated in the arrangements illustrated in the described Figures. In addition, while at least one of these components are implemented at least partially as an electronic hardware component, and therefore constitutes a machine, the other components may be implemented in software that when included in an execution environment constitutes a machine, hardware, or a combination of software and hardware.

More particularly, at least one component defined by the claims is implemented at least partially as an electronic hardware component, such as an instruction execution machine (e.g., a processor-based or processor-containing machine and/or as specialized circuits or circuitry (e.g., discreet logic gates interconnected to perform a specialized function). Other components may be implemented in software, hardware, or a combination of software and hardware. Moreover, some or all of these other components may be combined, some may be omitted altogether, and additional components may be added while still achieving the functionality described herein. Thus, the subject matter described herein may be embodied in many different variations, and all such variations are contemplated to be within the scope of what is claimed.

In the description above, the subject matter is described with reference to acts and symbolic representations of operations that are performed by one or more devices, unless indicated otherwise. As such, it will be understood that such acts and operations, which are at times referred to as being computer-executed, include the manipulation by the processor of data in a structured form. This manipulation transforms the data or maintains it at locations in the memory system of the computer, which reconfigures or otherwise alters the operation of the device in a manner well understood by those skilled in the art. The data is maintained at physical locations of the memory as data structures that have particular properties defined by the format of the data. However, while the subject matter is being described in the foregoing context, it is not meant to be limiting as those of skill in the art will appreciate that various of the acts and operations described hereinafter may also be implemented in hardware.

To facilitate an understanding of the subject matter described herein, many aspects are described in terms of sequences of actions. At least one of these aspects defined by the claims is performed by an electronic hardware component. For example, it will be recognized that the various actions may be performed by specialized circuits or circuitry, by program instructions being executed by one or more processors, or by a combination of both. The description herein of any sequence of actions is not intended to imply that the specific order described for performing that sequence must be followed. All methods described herein may be performed in any suitable order unless otherwise indicated herein or otherwise clearly contradicted by context.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

The embodiments described herein include the one or more modes known to the inventor for carrying out the claimed subject matter. It is to be appreciated that variations of those embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

What is claimed is:

1. An apparatus, comprising:
   a filter configured to receive a data signal for transmission and to filter the data signal to generate a filtered data signal;
   a gain regulator in electrical communication with the filter, the gain regulator configured to receive the filtered data signal for adjusting a gain of the filtered data signal to generate a gain regulator output signal for use in at least mitigating a signal reflection; and
   a controller in electrical communication with the filter and the gain regulator, the controller configured to:
   receive the filtered data signal,
   process the filtered data signal to measure a dynamic range of the filtered data signal,
   compare the dynamic range to a threshold,
   generate, based on the comparison, a first controller output signal that sets a first gain of the filter and a second controller output signal that sets a second gain of the gain regulator inversely proportional to the first gain, to operate the filter at an optimized dynamic range in which a subsequent filtered data signal generated by the filter operating in the optimized dynamic range is optimized for use in subtracting the signal reflection from received signals and thus at least mitigating the signal reflection.

2. The apparatus of claim 1, wherein the filter includes a finite impulse response (FIR) filter.

3. The apparatus of claim 1, wherein the filter includes a sparse finite impulse response (FIR) filter.

4. The apparatus of claim 1, wherein the gain regulator includes at least one of a digital-to-analog converter (DAC) or an analog-to-digital converter (ADC).

5. The apparatus of claim 1, the apparatus further comprising a signal reflection mitigator in communication with the gain regulator, the signal reflection mitigator configured to receive the gain regulator output signal for use in at least mitigating the signal reflection.

6. The apparatus of claim 1, wherein the controller is further configured such that the dynamic range is measured for a configurable amount of time.

7. The apparatus of claim 1, wherein the controller is configured to generate the first controller output signal and the second controller output signal based on at least one aspect of the signal reflection.

8. The apparatus of claim 1, wherein the controller is configured to generate the first controller output signal and the second controller output signal based on an error measurement.

9. A method, comprising:
filtering, utilizing a filter, a data signal to generate a filtered data signal;
adjusting, utilizing a gain regulator, a gain of the filtered data signal to generate a gain regulator output signal for use in at least mitigating a signal reflection;
processing, utilizing a controller, the filtered data signal to measure a dynamic range of the filtered data signal,
comparing, utilizing the controller, the dynamic range to a threshold, and
generating, utilizing the controller based on the comparison, a first controller output signal that sets a first gain of the filter and a second controller output signal that sets a second gain of the gain regulator inversely proportional to the first gain, to operate the filter at an optimized dynamic range in which a subsequent filtered data signal generated by the filter operating in the optimized dynamic range is optimized for use in subtracting the signal reflection from received signals and thus at least mitigating the signal reflection.

10. The method of claim 9, and further comprising:
receiving the gain regulator output signal; and
mitigating the signal reflection with the gain regulator output signal, utilizing a signal reflection mitigator.

11. The method of claim 9, and further comprising:
repeating the adjusting until a predetermined range is reached in connection with the filtered data signal.

12. A system, comprising:
a transmitter;
a receiver;
circuitry including:
a filter sub-circuit configured to filter a data signal directed to the transmitter to generate a filtered data signal,
a gain regulator sub-circuit configured to adjust a gain of the filtered data signal to generate an output signal, and
a controller sub-circuit configured to:
process the filtered data signal to measure a dynamic range of the filtered data signal,
compare the dynamic range to a threshold, and
generate, based on the comparison, a first control signal that sets a first gain for the filtering and a second control signal that sets a second gain, inversely proportional to the first gain, to operate the filtering at an optimized dynamic range in which a subsequent filtered data signal generated by the filtering operating in the optimized dynamic range is optimized for use in subtracting a signal reflection from received signals and thus at least mitigating the signal reflection; and
a signal reflection mitigator configured to remove the signal reflection received via the receiver, utilizing the subsequent filtered data signal.

* * * * *

UNITED STATES PATENT AND TRADEMARK OFFICE
CERTIFICATE OF CORRECTION

PATENT NO. : 10,135,548 B2
APPLICATION NO. : 15/232684
DATED : November 20, 2018
INVENTOR(S) : Takatori et al.

It is certified that error appears in the above-identified patent and that said Letters Patent is hereby corrected as shown below:

In the Claims

Column 14, Lines 9-12: Claim 10 should be modified to read as follows:
10. The method of claim 9, further comprising:
receiving the gain regulator output signal; and
mitigating the signal reflection with the gain regulator output signal, utilizing a signal reflection mitigator.

Column 14, Lines 13-15: Claim 11 should be modified to read as follows:
11. The method of claim 9, further comprising:
repeating the adjusting until a predetermined range is reached in connection with the filtered data signal.

Column 14, Lines 16-42: Claim 12 should be modified to read as follows:
12. A system, comprising:
a transmitter;
a receiver;
circuitry including:
 a filter sub-circuit configured to filter a data signal directed to the transmitter to generate a filtered data signal,
 a gain regulator sub-circuit configured to adjust a gain of the filtered data signal to generate an output signal, and
 a controller sub-circuit configured to:
  process the filtered data signal to measure a dynamic range of the filtered data signal,
  compare the dynamic range to a threshold, and
  generate, based on the comparison, a first control signal that sets a first gain for the filtering and a second control signal that sets a second gain for the adjusting, inversely proportional to the first gain, to operate the filtering at an optimized dynamic range in which a subsequent filtered data signal generated by the filtering operating in the optimized dynamic range is optimized for use in Signed and Sealed this
Twenty-eighth Day of May, 2019

Andrei Iancu
*Director of the United States Patent and Trademark Office*